United States Patent [19]
Buss et al.

[11] 3,935,439
[45] Jan. 27, 1976

[54] VARIABLE TAP WEIGHT CONVOLUTION FILTER

[75] Inventors: Dennis Darcy Buss, Cambridge, Mass.; Walter Howard Bailey, Richardson, Tex.

[73] Assignee: Texas Instruments Incorporated, Dallas, Tex.

[22] Filed: July 12, 1974

[21] Appl. No.: 487,105

[52] U.S. Cl............. 235/181; 235/197; 307/221 C; 307/221 D; 357/24
[51] Int. Cl.² .................... G06G 7/19; G11C 11/40
[58] Field of Search ...... 235/181, 150.53, 177, 193, 235/197; 357/24; 307/304, 221

[56] References Cited
UNITED STATES PATENTS

| | | | |
|---|---|---|---|
| 3,517,175 | 6/1970 | Williams | 235/177 |
| 3,660,697 | 5/1972 | Berglund et al. | 307/221 C |
| 3,670,151 | 6/1972 | Lindsay et al. | 235/181 |
| 3,760,172 | 9/1973 | Quate | 235/181 |
| 3,809,923 | 5/1974 | Esser | 307/221 D |
| 3,831,013 | 8/1974 | Alsup et al. | 235/181 |

OTHER PUBLICATIONS

Amelio: Physics and Applications of Charge-Coupled Devices IEEE Intercon Mar. 26-30, 1973, pp. 1-6.
Buss et al.: Matched Filtering Using Tapped Bucket-Brigade Delay Lines, Electronics Letters Feb. 1972 Vol. 8, No. 4. pp. 106-107.
Collins et al.: Analog Matched Filters Using Charge Coupled Devices, Nerem Record 1972 Technical Sessions, pp. 165-167.
White et al.: CCD and MNOS Devices for Programmable Analog Signal Processing, IEEE IEDM, Washington, D.C. Dec. 1973. pp. 130-133.

*Primary Examiner*—Felix D. Gruber
*Attorney, Agent, or Firm*—Harold Levine; James T. Comfort; Gary C. Honeycutt

[57] ABSTRACT

A variable tap weight convolution filter comprised of charge transfer devices which may be charge coupled devices, bucket brigade devices or a combination of the two, for performing convolutions of an input signal with tap weights from a second input signal, said tap weights varying as a function of time.

24 Claims, 7 Drawing Figures

VARIABLE TAP WEIGHT CONVOLUTION FILTER

FIELD OF THE INVENTION

This invention relates to charge transfer devices, including charge coupled devices (CCD) or bucket brigade devices (BBD), and which are employed for cross-correlation or convolution of two signals, both of which vary with time.

BACKGROUND OF THE INVENTION

It is well-known in the art to employ various devices for the processing of two signals through convolution. However, fixed tap weights are used as weighting coefficients for performing the convolution between the two signals, the operation being performed digitally. In analog applications, a digital filter requires the transforming of the analog signal to a form usable by a digital device, as well as requiring a large number of arithmetic operations to perform the convolution between two signals.

Accordingly it is a feature of this invention to provide an electronic device which directly receives analog signals and which performs a convolution between said analog signals with a minimum of time and apparatus required.

Other objects and features of the invention will become apparent to one skilled in the art upon consideration of the specification including the claims and the drawings.

SUMMARY OF THE INVENTION

In accordance with the present invention, a convolution is to be performed between two analog signals with semiconductor devices. The apparatus of the instant invention employs charge transfer device shaft register for accepting the input signals.

The convolution tap weights may be made to vary as a function of time continuously updating such tap weights. The update is accomplished by displacing the old tap weights held in the tap weight shift register with newly sampled values of the tap weight signal.

DESCRIPTION OF THE PREFERRED EMBODIMENTS

As set forth above, the present invention employs charge transfer devices, which include charge coupled devices and bucket brigade devices, for performing a convolution of two signals, utilizing variable tap weights. Such devices are used as shift registers in the convolution filter of the present invention, one shift register functioning to store tap weights from a time-variable input signal, and another shift register for receiving the signal to be convolved. Being fashioned from charge transfer devices, the shift registers are less complex than conventional shift registers and accordingly allow more economical applications.

In general a CCD stores charges proportional to analog input signals in potential wells, beneath electrodes disposed at and insulated from a semiconductor surface, moving these wells from electrode to electrode in order to transfer the charge with the resulting shift register function occurring.

A BBD commonly comprises a row of insulated gate field effect transistors (IGFETS) having their channels in series and storage capacitance provided between the gate and drain of each transistor. In integrated circuit form, a common doped region provides the drain for one transistor and the source for the next succeeding transistor, as well as providing an interconnection between them. The gate electrodes of the transistors are extended to overlap the respective drain regions sufficiently to provide the required gate-drain capacitances. The BBD transfers charge by providing a potential difference between storage capacitors at the site from which and the site to which the charge is to be transferred. When the potential difference is large enough the charge transfers from one capacitor to the next.

It is understood that any combination of CCD's or BBD's may be used for the input shift registers of the present invention.

Figure 1:
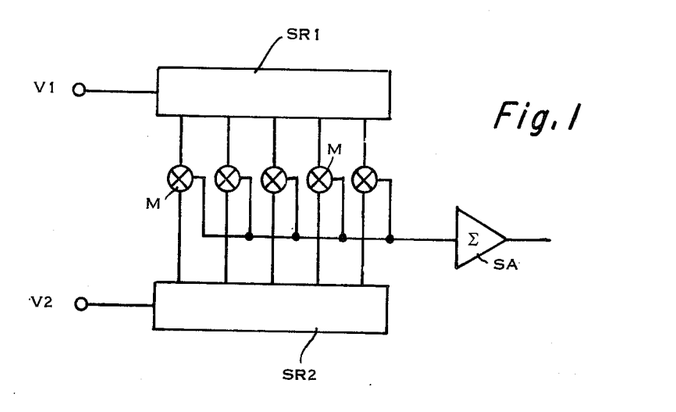
FIG. 1 is a block diagram of a variable tap weight convolution filter.

Essentially a device according to the present invention is illustrated by the block diagram of FIG. 1.

Two charge transfer device shift registers SR1 and SR2 are provided; these may both be CCD or BBD shift registers; alternatively one may be a CCD and the other a BBD shift register. Analog signals $V_1$ and $V_2$ are sampled and clocked into shift register SR1 and SR2 respectively and propagated along those shift registers in conventional manner. The sampled values of $V_2$ provide tap weights for the convolution operation to be performed. Signal levels stored at corresponding stages of each shift register are non-destructively detected and applied as inputs to multipliers M which provide outputs proportional to the products of the sampled values at each shift register stage. The outputs of the multipliers M are simultaneously summed or accumulated by a summation amplifier SA to provide a convolved output signal. The convolution of $V_1$ and $V_2$ is indicated by the symbols $V_1 \, x \, V_2$.

Figure 2:
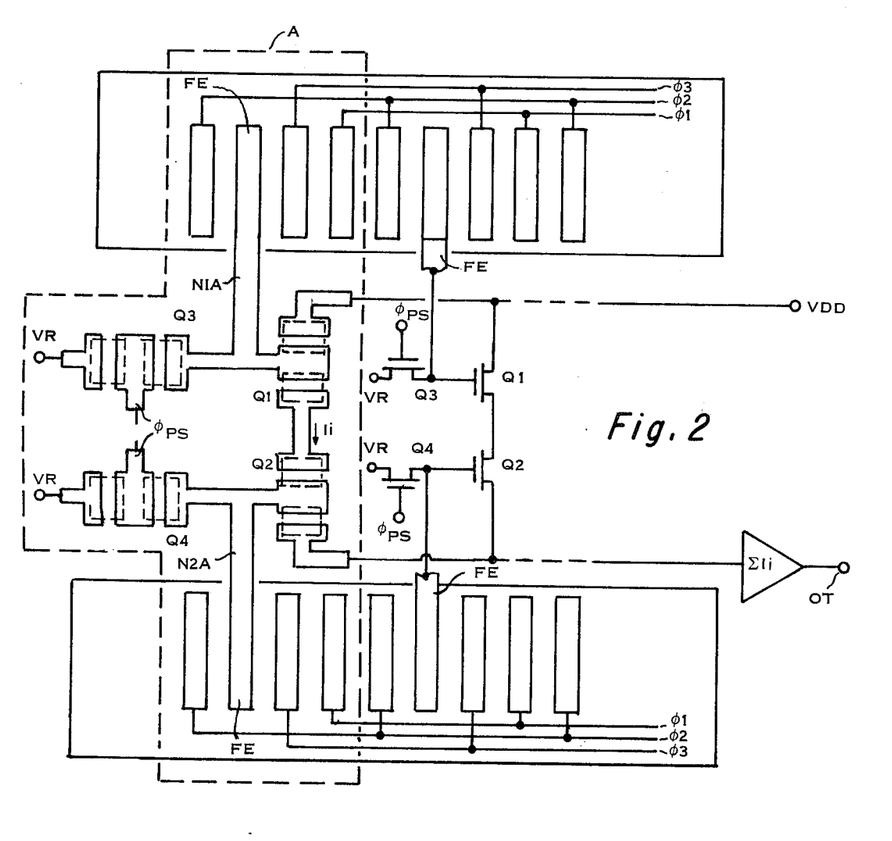
FIG. 2 is a schematic diagram of a charge coupled device shift register with amplifiers for receiving outputs therefrom.
Figure 3:
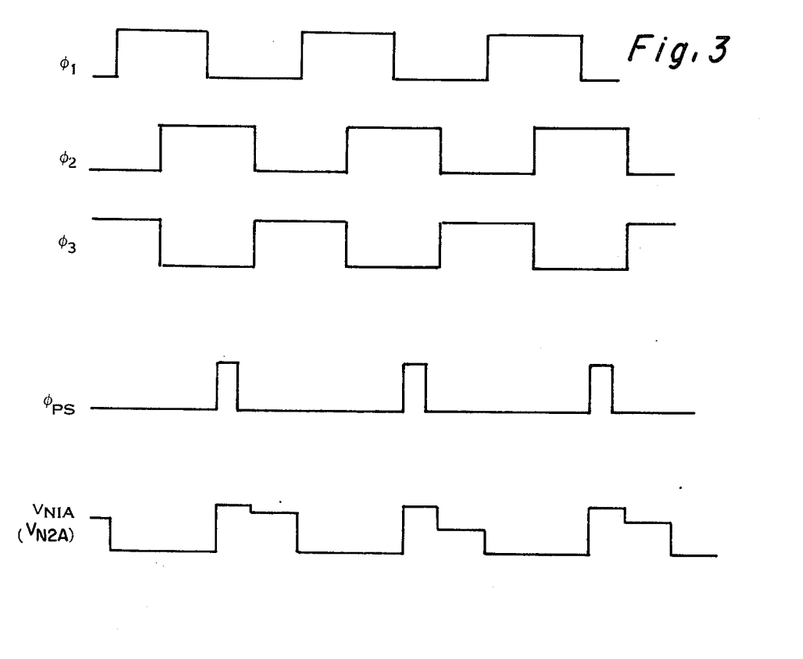
FIG. 3 shows clock pulse and signal waveforms pertinent to operation of FIG. 2.

FIG. 2 illustrates in greater detail a portion of a system as shown in FIG. 1 using CCD shift registers SR1 and SR2. Associated clock pulse timing diagrams are illustrated by FIG. 3. The CCD shift registers SR1 and SR2 are illustrated in FIG. 2 as 3-phase registers with the transfer electrodes connected to clock pulse phase lines as shown. However, any polyphase CCD shift register system could be used, the choice being determined by the particular application involved. In both shift registers, each stage incorporates a floating gate amplifier for non-destructive detection or sampling of the signal level stored at that stage. Thus, in each stage of the shift registers SR1 and SR2, a floating electrode FE (i.e., an electrode not connected to a clock pulse phase) is located between the $\phi_2$ and $\phi_3$ phase transfer electrodes. Considering A of shift register 1 and shift register 2, the floating electrodes FE thereof are connected to (or extended to form) the gate electrodes of respective IGFETs $Q_1$ and $Q_2$, the source of transistor $Q_1$ being connected to the drain of transistor $Q_2$ with an output taken from the source of transistor $Q_2$ so that transistors $Q_1$ and $Q_2$ function as a source follower amplifier. Respective preset IGFET transistors $Q_3$, $Q_4$ have their sources connected to the gates of transistors $Q_1$ and $Q_2$, the gate of each transistor $Q_3$ being connected to receive preset pulses $\phi PS$. For clarity, FIG. 2 illustrates a structural configuration and a circuit schematic for the floating gate amplifier just described.

The drains of transistors $Q_1$ of all the stages of the shift register SR1 are connected to a common drain supply $V_{DD}$ while the sources of transistors $Q_2$ of all the stages of shift register SR2 are connected as a common input to a current summation amplifier SA having an output terminal OT.

Operation of the system illustrated by FIG. 2 may be explained as follows. With clock signal $\phi_2$ on, signal sample related charges are stored beneath the $\phi_2$ electrodes in shift registers SR1 and SR2. During a portion of the on period of clock pulse $\phi_2$ that does not overlap the associated $\phi_1$ pulse period, a short precharge pulse $\phi PS$ is applied to the gates of transistors $Q_3$ and $Q_4$ to precharge the floating gate nodes N1A and N2A of shift registers SR1 and SR2 to a predetermined voltage. When clock pulse $\phi_2$ switches to an off condition, charges corresponding to the signal levels previously stored beneath the phase $\phi_2$ electrodes are transferred to beneath the floating gate electrodes FE in the respective shift registers SR1 and SR2, giving rise to corresponding gate voltages $V_{Si}$ at transistor $Q_1$ and $V_{Gi}$ at transistor $Q_2$. The resulting current $I_i$ through the transistors $Q_1$ and $Q_2$ is thus proportional to the product $V_{Gi} \times V_{Ii}$. The nodes N1A and N2A may be reset to a reference potential prior to occurrence of the next $\phi_1$ pulse. It is not necessary to reset every clock period, however.

The product current $I_i$ for all of the stages of the shift registers are applied as a common input to the current summing amplifier SA to produce a convolved output signal at the output terminal OT.

In FIG. 3, the same waveform is shown for nodes N1A and N2A for the sake of simplicity; however, it will be appreciated that the actual voltages of these nodes will normally differ, depending on the respective values of signal related voltages $V_{Si}$ and $V_{Gi}$.

When floating gate amplifiers are fabricated with two levels of conducting material (double level process) a part or all of the floating gate may lie beneath clock electrodes.

In place of a floating gate amplifier as described with reference to FIG. 2, a floating diffusion amplifier may be used. In that case, doped (e.g., diffused) regions would be formed in the semiconductor substrate at locations corresponding to the floating electrodes FE which would be omitted. The doped regions would extend beyond the transfer electrodes in a direction laterally of the signal propagation direction along the shift registers, and the gate electrodes of transistors $Q_1$ and $Q_2$ would be extended to ohmically connect with the corresponding doped regions in the shift registers SR1 and SR2 respectively.

Figure 4:
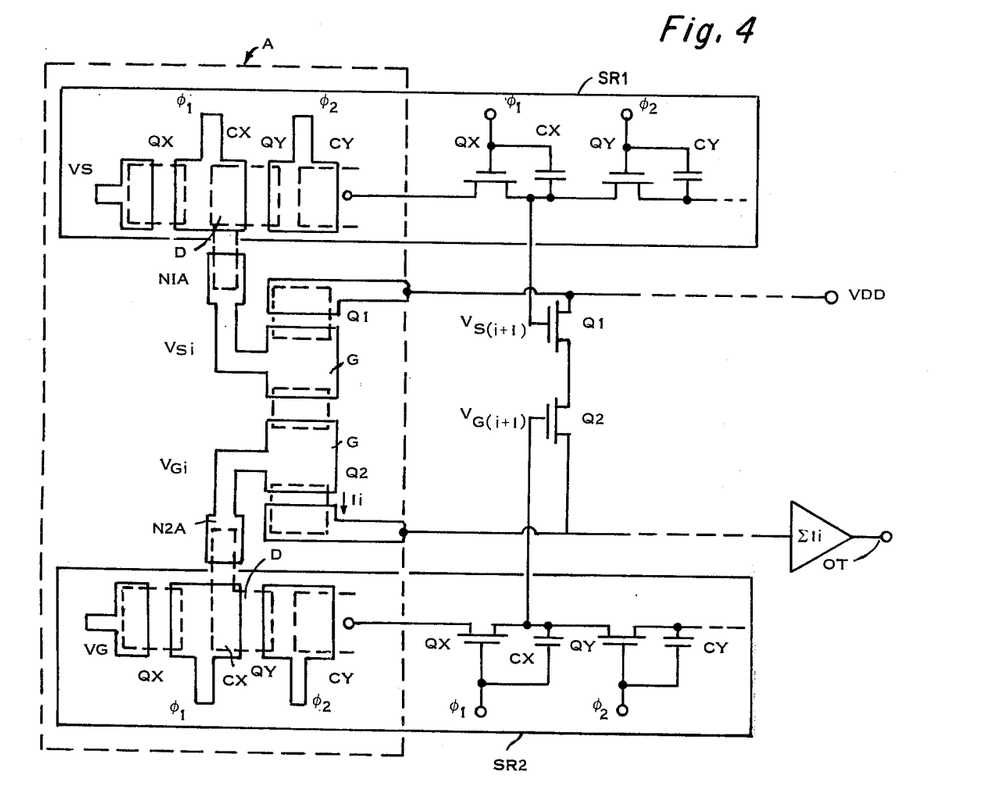
FIG. 4 is a schematic diagram of a bucket brigade device shift register with amplifiers for receiving outputs therefrom.

FIG. 4 shows an embodiment of the invention utilizing BBD shift registers SR1 and SR2 in conjunction with floating diffusion amplifiers for signal detection at the shift register stages. In the shift registers SR1 and SR2, each stage is defined by two IGFETS $Q_X$ and $Q_Y$ with associated gate-drain capacitances $C_X$ and $C_Y$.

Application of $\phi_1$ phase clock pulses to the gates of transistors $Q_X$ transfers signal related charge to the associated capacitances $C_X$ from the capacitances $C_Y$ of the transistors $Q_Y$ of the respective preceding stages. During a $\phi_2$ phase clock pulse applied to transistors $Q_Y$ (non-concurrently with $\phi_1$) charge is transferred to capacitances $C_X$ of transistors $Q_X$ from the capacitances $C_Y$ of the transistors $Q_Y$ of the respectively succeeding stages corresponding to signal propagation from $C_Y$ to $C_X$. For convenience, FIG. 4 shows representative shift register stages in structural format and in circuit schematic format, and the stages would be continued to the right to provide a desired number of stages in each shift register.

Considering stages A of shift registers SR1 and SR2, the drain regions D of transistors $Q_X$ are extended laterally of the direction of charge propagation along the shift registers. Transistors $Q_1$ and $Q_2$ have gate electrodes G ohmically connecting with the extensions of the drain regions D of transistors $Q_X$ in shift registers 1 and shift register 2 respectively. The source of transistor $Q_1$ is connected with the drain of transistor $Q_2$ and these two transistors function as a linear source follower amplifier with the drains of transistors $Q_1$ of each stage connected to a common supply voltage $V_{DD}$, while the sources of the transistors $Q_2$ of each stage are applied as a common input to a current summation amplifier SA.

The operation of the system may be explained as follows. Input signals $V_G$ are applied to the shift register SR2 to store required tap weight signals in the respective stages of that shift register. An analog signal $V_S$ to be convolved is sampled and clocked into the shift register SR1. A charge stored at the node $N_{A1}$ of shift register SR1 having a magnitude depending on the associated sample of the input voltage $V_S$, gives rise to a corresponding gate voltage $V_{Si}$ at transistor $Q_1$ of stage A. Likewise, a gate voltage $V_{Gi}$ is applied to the transistor $Q_2$ of stage A as a result of the tap weight related charge stored at node N2A of shift register 2. The resultant current $I_i$ flowing through transistors $Q_1$ and $Q_2$ is then proportional to the product $V_{Si} \times V_{Gi}$. These product currents are summed by the current summation amplifier SA to provide an output convolution signal at the terminal OT.

At this point, it is important to consider the manner in which the currents $I_i$ are combined. In sampling an input signal to be utilized as the tap weight function, the fact of its being time-variable indicates that both positive and negative weighting coefficients may be encountered.

In general, positive and negative weighting coefficients are connected respectively to positive and negative summing buses, with the signals being combined through a differential amplifier. There are two basic methods which may be employed to accomplish this.

First, only the magnitude of the input signal $V_G$ would be applied to the shift register SR2. This may be accomplished by full wave rectification of the signal, with the arithmetic sense of the signal being retained by a digital shift register. The sources of transistors $Q_2$ would then not all be connected in common to a single summation amplifier SA, but would be selectively connectable to either a positive or a negative current summation amplifier, dependent on the sign of the corresponding tap weights, under control of the digital sense shift register.

Alternatively, one could use two shift registers in the place of former shift register SR2. The tap weight signal $V_G$ would be applied to the first shift register SR2A, the inverse of the tap weight signal applied to the second shift register SR2B, with only the positive voltages activating the load transistor $Q_2$ in each transistor. The negative voltages would correspond to a zero weighting coefficient and therefore would not be used.

This technique would also require the use of two summing buses, one for each shift register, SR2A, SR2B, which are connected to the appropriate inputs of a differential amplifier.

Figure 5:
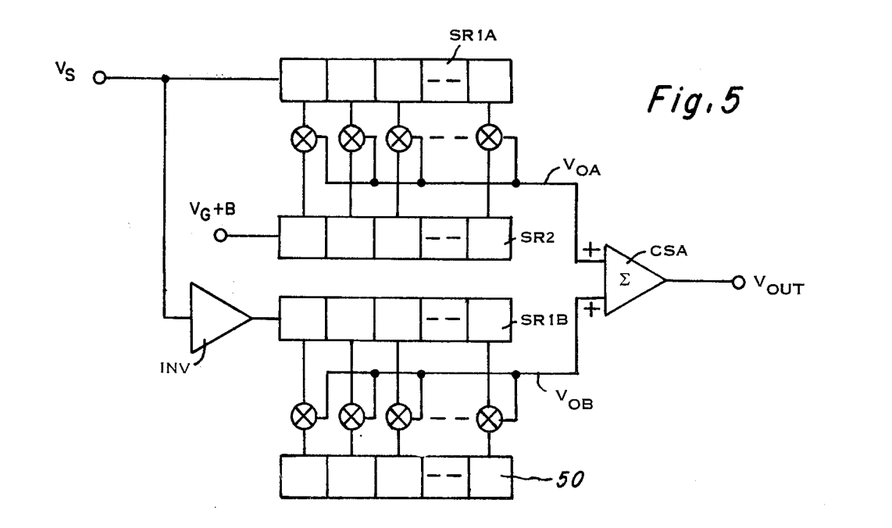
FIG. 5 is an illustration of apparatus embodying the invention for handling positive and negative weighting coefficients.

There is a third apparatus which may be employed in accord with the present invention to solve the problem of handling positive and negative weighting coefficients. Specifically, the tap weight input signals $V_G$ into shift register SR2 (FIG. 5) are offset from their normal value by the addition of a d-c component (B) so that a zero value of weighting coefficient would be represented by a voltage which gives a load conductance midway between its minimum and maximum value. A positive weighting coefficient would then be represented by a larger conductance (than the median value) and a negative coefficient would be represented by a smaller conductance (than the median value). Under these conditions the weighting coefficients of the signals at the $i$ th stage of the shift register SR2 will be $$H_i(t) = V_{Gi}(T_{di}-t) + B$$

where
  $H_i$ = ith weighting coefficient
  $V_{Gi}$ = amplitude of the sampled signal stage $i$
  $T_{di}$ = delay time between the input of a signal to the shift register and the sampling of such signal at stage $i$.

The convolution signal $V_{OA}$, then depends on $V_S \times (V_G+B)$.

It now becomes necessary to cancel the term $B \times V_S$ from the output signal $V_{OA}$. As shown in FIG. 5, this is accomplished by applying the input signal $V_S$ to shift registers SR1A and via an inverter INV to shift register SR1B.

A unit 50, which may be a shift register storing constant tap weight signals, or which may be conventional weighting means applies fixed tap weight coefficients having the value B to the signals sampled at the stages of the shift register SR1B which receives the inverse of input signal $V_S$. Thus, the convolved signal on line $V_{OB}$ is dependent on $[-V_S \times B]$. The signals on lines $V_{OA}$ and $V_{OB}$ are applied as non-inverting inputs to a current summation amplifier CSA which produces an output signal $V_{out}$ proportional to $V_S \times V_G$, i.e., the d.c. component B has been canceled.

Figure 6:
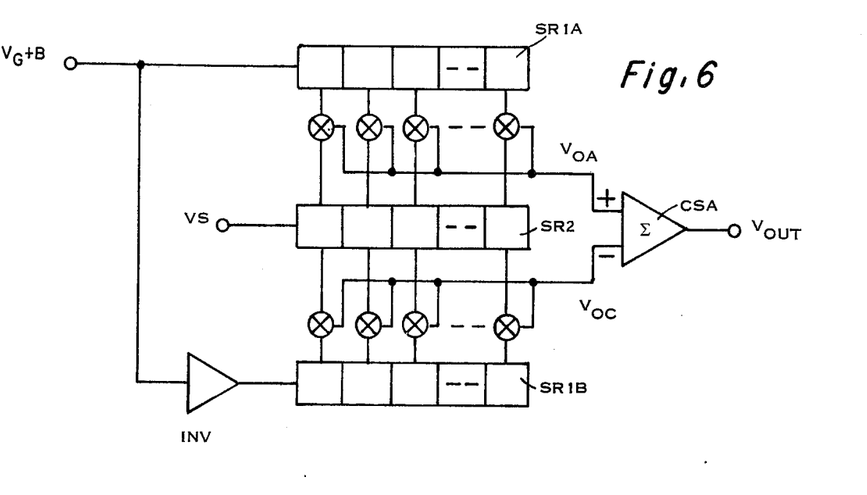
FIGS. 6 and 7 are block diagrams of other embodiments of apparatus embodying the invention for handling positive and negative weighting coefficients.

FIG. 6 is a block diagram form represents a further embodiment which may be utilized in the cancellation of the constant term B, which has been added to the top weighting signal $V_G$. The weighting coefficient $h_i^A$ from the combination of the tap weight signal $V_{Gi} + B$ from the ith stage of the shift register SR1A for the signal $V_{Si}$ from the ith stage of shift register SR2 appears as:

$$h_i^A(t) = V_{Gi}(T_{di} - t) + B$$

$T_{di}$ = delay time between the analog sample being inputted to the shift register SR1A and the detection thereof at the $i$th stage
  $h_i^A(t)$ = weighting function at a time $t$ at the $i$ th stage
  B = the constant component added to the signal Consequently, the convoluted signal at $V_{OA}$ is $R\Sigma_i [V_{Si}V_{Gi} + BV_{Si}]$ Similarly, the convoluted signal at $V_{OC}$ is $R\Sigma_i [-V_{Si}V_{Gi} + BV_{Si}]$ where R is a gain factor and the time dependence of $V_{Si}$ and $V_{Gi}$ is implicit. Application of the signals $V_{OA}$ and $V_{OC}$ are non-inverting and inverting inputs, respectively to the current summation amplifier CSA provides an output signal $V_{out} = 2R \Sigma_i V_{Si} \times V_{Gi}$ which is equivalent to the convolution operation $2RV_S \times V_G$.

Figure 7:
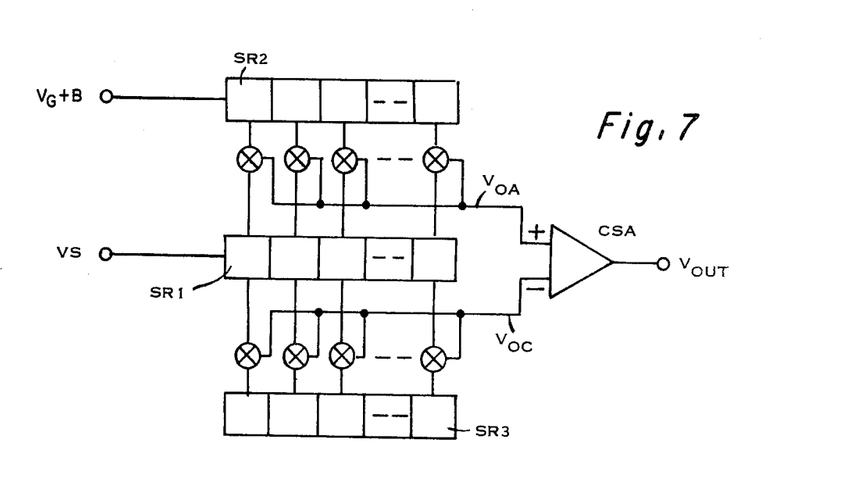

In another embodiment shown at FIG. 7, a CTD shift register SR2 receives a tap weight signal $V_G$ offset by a constant d.c. component B. Shift register SR2 generates weighting signals for convolution with analog input signal $V_S$ inputted to CTD shift register SR1. In a separate operation, the input signal samples of $V_S$ are weighted by the constant d.c. component B, e.g., using a shift register SR3 having constant level signals stored at each stage thereof or using conventional weighting means.

The tap weights applied from the $i$ th stage of shift register SR2 is thus $h_i^A(t) = V_{Gi}(T_{di} - t) + B$. and the tap weight from the $i$ th stage of shift register SR3 is
  $h_i^C(t) = B$ The resultant convoluted signals on output lines $V_{OA}$ and $V_{OC}$ are applied, respectively, as non-inverting and inverting inputs to current summing amplifier SCA to produce an output signal
  $V_{out} \alpha V_S \times V_G$.

The modification of a shift register SR1 as shown in FIG. 2 or FIG. 4 to function as illustrated by FIG. 7 is straight forward and will not be described in detail.

What is claimed is:

1. Analog signal processing apparatus comprising:
    a first analog charge transfer device for receiving sampled values of a first analog signal and storing said sampled values at charge storage sites of said charge transfer device;
    a second analog charge transfer device for receiving sampled values of a second analog signal and storing said sampled values at charge storage sites of said charge transfer device;
    each of said first and second analog charge transfer devices including a like plurality of stages each including a plurality of charge storage sites, at each said stage a plurality of electrodes for receiving multi-phase clock pulses to transfer said analog signal samples along said charge transfer device;
    analog signal multiplier means for corresponding pairs of said first and second analog charge transfer devices, for producing an output signal proportional to the product of first and second analog signal samples stored at the said corresponding stages of said first and second charge transfer devices, said analog signal multiplier means including first and second input electrodes electrically coupled to said corresponding stage of said first and second charge transfer devices for nondestructive detection of amplitudes of analog signal samples stored at said respective corresponding stages to apply analog pulse inputs to said first and second input electrodes; and
    means for summing the outputs of said multiplier means.

2. The device of claim 1, wherein said charge transfer devices are charge coupled devices.

3. The device of claim 1, wherein said charge transfer devices are bucket brigade devices.

4. The device of claim 1, wherein said charge transfer devices comprise a combination of charge coupled devices and bucket brigade devices.

5. Analog signal processing apparatus, according to claim 1, wherein said signal multiplier means for each of said corresponding pairs of stages includes first and second insulated gate field effect transistor amplifier structures having channels connected in series between a supply voltage line and a common output signal line, means electrically coupling the gate of said first transistor to a predetermined charge storage site of said stage of said first charge transfer device for non-destructive detection of the amplitude of a signal sample stored at said particular storage site to apply an analog input pulse to said first transistor; and means electrically coupling the gate of said second transistor to a particular charge storage site of the corresponding stage of said second charge transfer device for non-destructive detection of a signal sample stored at said corresponding particular storage site to apply an analog input pulse to said second transistor; and means for connecting said common output signal line to said means for summing the output of said multipliers.

6. The device of claim 5, wherein said charge transfer devices are charge coupled devices and said field effect transistor amplifiers are floating gate amplifiers, portions of the floating gates of said first transistor amplifier and of said second transistor amplifier being located adjacent respective individual first and second charge coupled device shift register electrodes for receiving a predetermined phase of said multi-phase clock pulses, and including means for applying a predetermined reference pulse level to said floating gates during said predetermined phase of said multi-phase clock pulses.

7. The device of claim 5, wherein said charge transfer devices are charge coupled devices and said field effect transistor amplifiers are floating diffusion amplifiers.

8. The device of claim 5, wherein said charge transfer devices are bucket brigade devices and said field effect transistor amplifiers are floating diffusion amplifiers.

9. The device of claim 5, wherein one of said charge transfer devices is a charge coupled device and the other of said charge transfer devices is a bucket brigade device, and wherein the particular charge storage site of each stage of said charge coupled device includes a floating gate coupled to the gate of one of said first and second transistors of the signal multiplier means coupled to that stage and including means for applying a predetermined reference pulse to said floating gates when an analog signal sample is stored at the said particular storage sites of said charge coupled device shift register.

10. The device of claim 5, wherein one of said charge transfer devices is a charge coupled device and the other of said charge transfer devices is a bucket brigade device, and wherein the particular charge storage site of each stage of said charge coupled device includes a floating diffusion electrically coupled to the gate of one of said first and second transistors of said signal multiplier means coupled to that stage.

11. The device of claim 5, wherein one of said charge transfer devices is a charge coupled device and the other of said charge transfer devices is a bucket brigade device and wherein the particular charge storage site of each stage of said bucket brigade device includes a floating diffusion coupled to the gate of one of said first and second transistors of said signal multiplier means coupled to that stage.

12. Analog signal processing apparatus comprising:

a first charge transfer device analog shift register for receiving a first analog signal ($V_G$) added to a non-zero d.c. reference level (B) to provide a unipolar signal input to said analog shift register and for storing a plurality of sampled values of said unipolar signal input at charge storage sites of said first shift register;

inverter means for inverting said unipolar signal input, said inverter means connected in parallel with said first charge transfer device;

a second charge transfer device analog shift register for receiving a second analog signal and for storing a plurality of sampled values of said second analog signal at charge storage sites of said second charge transfer device;

a third charge transfer device analog shift register for receiving said inverted unipolar signal input from said inverter means;

each of said charge transfer device shift registers including a like plurality of stages each having a plurality of charge storage sites, at each said stage a plurality of electrodes for receiving multi-phase clock pulses to transfer said signal samples along said charge transfer device;

first analog signal multiplier means for corresponding pairs of stages of said first and second charge transfer devices, for producing an output signal proportional to the product of first and second signal samples stored at the said corresponding stages of said first and second charge transfer devices, said first signal multiplier means including first and second input electrodes electrically coupled to said corresponding stages of said first and second charge transfer devices for non-destructive detection of amplitudes of signal samples stored at said corresponding stages to apply analog pulse inputs to said first and second input electrodes;

second analog signal multiplier means for corresponding pairs of stages of said second and third charge transfer devices, for producing an output signal proportional to the product of second and third signal samples stored at the said corresponding stages of said second and third charge transfer devices, said second signal multiplier means including first and second inputs electrically coupled to said corresponding stages of said second and third charge transfer devices for non-destructive detection of amplitudes of signal samples stored at said corresponding stages to apply analog pulse inputs to said first and second input electrodes; and signal summation means for algebraically summing the outputs of said first and second signal multiplier means to eliminate said d.c. reference level (B) added to said first analog signal and for producing an output signal.

13. The device of claim 12, wherein said charge transfer devices are charge coupled devices.

14. The device of claim 12, wherein said charge transfer devices are bucket brigade devices.

15. The device of claim 12, wherein at least one of said charge transfer devices comprise a charge coupled device and the or each other said charge transfer device comprises a bucket brigade device.

16. Analog signal processing apparatus comprising:

a first charge transfer device analog shift register for receiving a first analog signal ($V_G$) having a predetermined non-zero d.c. reference level (B) to provide a unipolar signal input and storing a plurality of sampled values of said unipolar signal input ($V_G + B$) at charge storage sites of said first shift register;

a second charge transfer device analog shift register for receiving a second analog signal ($V_S$) and storing a plurality of sampled values of said second analog signal at charge storage sites of said second shift register;

each of said first and second charge transfer devices including a like plurality of stages each including a plurality of charge storage sites, at each said stage of plurality of electrodes for receiving multi-phase clock pulses to transfer said analog signal samples along said charge transfer device;

means for applying to said stored sampled values of said second analog signal, a constant weighting coefficient equal to said constant d.c. reference level (B) applied to said first analog signal and for producing correspondingly amplitude weighted analog signals;

signal multiplier means for corresponding pairs of stages of said first and second charge transfer devices, for producing an output signal proportional to the product of first and second analog signal samples stored at the said corresponding stages of said first and second charge transfer devices, said signal multiplier means including first and second input electrodes electrically coupled to said corresponding stages of said first and second charge transfer devices for non-destructive detection of amplitudes of signal samples stored at said corresponding stages to apply analog pulse inputs to said first and second input electrodes; and means for algebraically summing the outputs of said signal multiplication means with said amplitude weighted analog signals and for eliminating said d.c. reference level to produce an output signal.

17. The device of claim 16, wherein said charge transfer devices are charge coupled devices.

18. The device of claim 16, wherein said charge transfer devices are bucket brigade devices.

19. The device of claim 16, wherein at least one of said charge transfer devices is a charge coupled device and the or each remaining charge transfer device is a bucket brigade device.

20. Analog signal processing apparatus comprising:

a first charge transfer device analog shift register for receiving a first analog signal ($V_S$) and storing a plurality of sampled values of said first analog signal at charge storage sites of said shift register;

signal inverter means for receiving said first analog signal ($V_S$), said inverter means connected in parallel with said first charge transfer device;

a second charge transfer device analog shift register for receiving a second analog signal ($V_G$) having a predetermined non-zero d.c. reference level (B) to provide a unipolar input signal, and storing a plurality of sampled values of said unipolar input signal at charge storage sites of said second charge transfer device;

analog signal inverter means for receiving said first analog signal ($V_S$), said inverter being connected in parallel with said first charge transfer device;

a third charge transfer device analog shift register for receiving said inverted first analog signal from the output of said inverter means and for storing a plurality of sampled values of said inverted first analog signal at charge storage sites of said third charge transfer device;

means for applying to said stored sampled values of said inverted first analog signal, a constant weighting coefficient equal to said d.c. reference level (B) applied to said second analog signal and for producing correspondingly amplitude weighted analog signals;

each of said first, second, and third transfer devices including a like plurality of stages each including a plurality of charge storage sites, at each said charge storage site a plurality of electrodes for receiving multiphase clock pulses to transfer said signal samples along said charge transfer device;

analog signal multiplier means for corresponding pairs of stages of said first and second charge transfer devices, for producing an output signal proportional to the product of samples of said first analog signal and said unipolar signal stored at the said corresponding stages of said first and second charge transfer devices, said analog signal multiplier menas including first and second input electrodes electrically coupled to said corresponding stages of said first and second charge transfer devices for non-destructive detection of amplitudes of signal samples stored at said corresponding stages to apply analog pulse inputs to said first and second input electrodes; and signal summation means for summing said amplitude weighted first analog signal samples and the output from said signal multiplier means algebraically to eliminate said d.c. reference level and said constant weighting coefficient.

21. The device of claim 20, wherein said charge transfer devices are charge coupled devices.

22. The device of claim 20, wherein said charge transfer devices are bucket brigade devices.

23. The device of claim 20, wherein at least one of said charge transfer devices comprises a charge coupled device and the or each remaining charge transfer device comprises a bucket brigade device.

24. A variable tap weight convolution filter comprising:

1. first and second charge transfer device analog shift registers including a plurality of stages each defining at least one charge storage site, said shift registers each having input means for receiving samples of respective first and second analog signals for storage at said storage sites; each of said charge transfer devices further including a like plurality of electrodes for receiving multiphase clock pulses to transfer said analog signal samples along the stages of said charge transfer device;

2. for each storage of said first shift register and a corresponding stage of said second shift register, signal multiplication means comprising:

a. first and second insulated gate field effect transistors connected to define a source follower amplifier;

b. means coupling the gate of said first transistor to said stage of said first shift register for non-destructive detection of a signal sample stored at said stage and for applying a related gate bias voltage to said first transistor;

c. means coupling the gate of said second transistor to said corresponding stage of said second shift register for non-destructive sampling of a signal sample stored at said corresponding stage and to apply a related gate bias voltage to said second transistor; and means connecting said source follower amplifiers between a supply voltage line and a common output line, whereby each said source follower amplifier produces an output signal proportional to the product of the amplitudes of said gate bias voltages applied thereto; and 3. signal summation means connected to said common output line for producing a convolution output signal.

\* \* \* \* \*